(12) United States Patent
Beak et al.

(10) Patent No.: US 9,040,365 B2
(45) Date of Patent: May 26, 2015

(54) METHOD FOR FABRICATING THIN FILM TRANSISTOR ARRAY SUBSTRATE

(71) Applicant: LG DISPLAY CO., LTD., Seoul (KR)

(72) Inventors: JungSun Beak, Paju-si (KR); Jeong Oh Kim, Goyang-si (KR); Jong Won Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 316 days.

(21) Appl. No.: 13/622,913

(22) Filed: Sep. 19, 2012

(65) Prior Publication Data

US 2013/0071973 A1    Mar. 21, 2013

(30) Foreign Application Priority Data

Sep. 19, 2011    (KR) .................. 10-2011-0094256

(51) Int. Cl.

| | |
|---|---|
| *H01L 21/84* | (2006.01) |
| *H01L 27/12* | (2006.01) |
| *H01L 21/3213* | (2006.01) |
| *H01L 29/66* | (2006.01) |
| H01L 29/786 | (2006.01) |
| G02F 1/1343 | (2006.01) |
| G02F 1/1362 | (2006.01) |

(52) U.S. Cl.
CPC ....... *H01L 27/1288* (2013.01); *H01L 29/78669* (2013.01); *G02F 2001/134318* (2013.01); *H01L 21/32139* (2013.01); *H01L 29/66765* (2013.01); *G02F 1/136286* (2013.01); *G02F 1/136227* (2013.01); *G02F 2001/134372* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 8,609,477 B2* | 12/2013 | Song et al. ............... | 438/158 |
| 8,669,557 B2* | 3/2014 | Kwack et al. ............ | 257/59 |
| 2005/0078256 A1* | 4/2005 | Hong ....................... | 349/141 |
| 2005/0270450 A1* | 12/2005 | Ahn et al. ................ | 349/114 |
| 2007/0002264 A1* | 1/2007 | Kim ......................... | 349/156 |
| 2010/0128208 A1* | 5/2010 | Kurasawa ................ | 349/106 |
| 2012/0057115 A1* | 3/2012 | Kunimatsu et al. ..... | 349/123 |
| 2012/0176561 A1* | 7/2012 | Kim et al. ................ | 349/46 |
| 2012/0313845 A1* | 12/2012 | Onogi et al. ............. | 345/92 |
| 2013/0020641 A1* | 1/2013 | Nishikawa ............... | 257/347 |

* cited by examiner

*Primary Examiner* — Richard Booth
(74) *Attorney, Agent, or Firm* — Brinks Gilson & Lione

(57) ABSTRACT

A method of fabricating a thin film transistor array substrate is disclosed. The method includes: sequentially forming a first passivation layer, a photo acryl layer and a first transparent metal layer on the substrate provided with the source/drain electrodes and so on; forming a common electrode, which is disposed in the pixel region, and first through third contact holes, which are positioned in regions of the drain electrode, the gate pad and the data pad, respectively, using one of a half-tone mask and a diffractive mask; forming a second passivation layer on the substrate provided with the first through third contact holes; exposing the drain electrode, the gate pad and the data pad by removing the first and second passivation layers from the drain electrode region, the gate pad region and data pad region; and forming a pixel electrode on the second passivation layer opposite to the common electrode by forming a second transparent metal layer on the substrate and performing a third mask procedure for the second transparent metal layer.

14 Claims, 4 Drawing Sheets

METHOD FOR FABRICATING THIN FILM
TRANSISTOR ARRAY SUBSTRATE

This application claims the priority and the benefit under 35 U.S.C. §119(a) on Korean Patent Application No. 10-2011-0094256, filed on Sep. 19, 2011, the entire contents of which are hereby incorporated by reference.

BACKGROUND

1. Field of the Invention

The present disclosure relates to a method of fabricating a thin film transistor array substrate.

2. Discussion of the Related Art

In general, LCD devices control the light transmittance of a liquid crystal with a dielectric anisotropy using an electric field, in order to display an image. The LCD devices are usually fabricated by combining a color filter array substrate with a thin film transistor array substrate in the center of a liquid crystal layer.

Recently, LCD devices of several new modes have been developed in order to resolve a narrow viewing angle of the related art LCD device. LCD devices with wide viewing angle characteristics are classified into an in-plane switching (IPS) mode, an optically compensated birefringence (OCB) mode, a fringe field switching (FFS) mode, or other modes.

Among the LCD devices with the wide viewing angle, the IPS mode LCD device allows a pixel electrode and a common electrode to be arranged on the same substrate so that a horizontal electric field is induced between the electrodes. As such, major axes of liquid crystal molecules are aligned in a horizontal direction with respect to the substrate. Accordingly, the IPS mode LCD device has a wider viewing angle than that of a TN (Twisted Nematic) mode LCD device of the related art.

Also, a FFS (Fringe Field Switching) mode LCD device includes a pixel electrode and a common electrode, which are formed in different layers from each other and allows a electric field to be formed in an up-and-down direction (i.e., a vertical direction). Such a FFS mode LCD device is recently fabricated to include a photo acryl layer with a low dielectric constant, in order to reduce power consumption and load between wires.

However, the photo acryl layer causes additional processes, such as a contact hole formation process and others, to be performed. Due to this, the number of fabrication processes for the FFS mode LCD device must increase.

Therefore, it is necessary to reduce the number of fabrication processes even though the photo acryl layer is formed for the fabrication of an LCD device having high definition and low power consumption.

BRIEF SUMMARY

A fabrication method of a thin film transistor array substrate includes: preparing a substrate defined into a display area and a non-display area; forming a gate electrode and a gate line, which are disposed in the display area, and a gate pad and a data pad, which are disposed in the non-display area, by forming a metal film on the substrate and performing a first mask procedure for the metal film; sequentially forming a gate insulation film and a channel layer on the substrate provided with the gate electrode and so on; forming source/drain electrodes and a data line by forming a source/drain metal film on the substrate provided with the channel layer and performing a second mask procedure for the source/drain metal film; sequentially forming a first passivation layer, a photo acryl layer and a first transparent metal layer on the substrate provided with the source/drain electrodes and so on; forming a common electrode, which is disposed in the pixel region, and first through third contact holes, which are positioned in regions of the drain electrode, the gate pad and the data pad, respectively, using one of a half-tone mask and a diffractive mask; forming a second passivation layer on the substrate provided with the first through third contact holes; exposing the drain electrode, the gate pad and the data pad by removing the first and second passivation layers from the drain electrode region, the gate pad region and data pad region; and forming a pixel electrode on the second passivation layer opposite to the common electrode by forming a second transparent metal layer on the substrate and performing a third mask procedure for the second transparent metal layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE DRAWINGS AND THE PRESENTLY PREFERRED EMBODIMENTS

Figure 1:
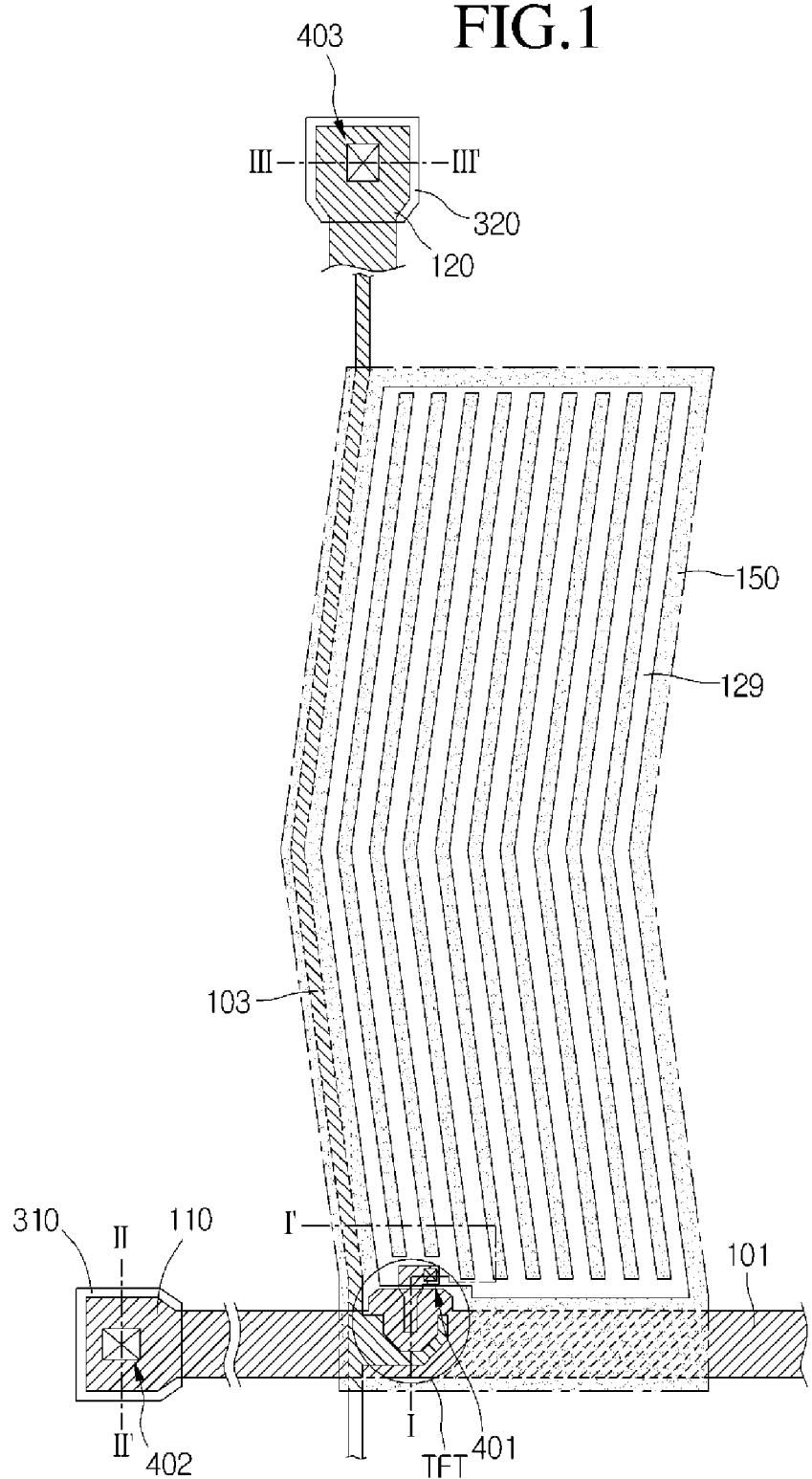
FIG. 1 is a planar view showing a pixel region of a thin film transistor array substrate an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly)

may be present. The term "on" or "under" of an element will be determined based on the drawings.

In the drawings, the sizes and thicknesses of elements can be exaggerated, omitted or simplified for clarity and convenience of explanation, but they do not mean the practical sizes of elements.

FIG. 1 is a planar view showing a pixel region of a thin film transistor array substrate an embodiment of the present disclosure.

Referring to FIG. 1, the IPS mode LCD device according to the embodiment of the present disclosure can be defined into a display area in which a plurality of sub-pixel regions, and a non-display area including a pad region. The sub-pixel regions are defined by gate lines 101 and data lines 103 crossing each other.

A thin film transistor TFT, as a switching element, is disposed at an intersection of the gate line 101 and the data line 103. The thin film transistor TFT can include a gate electrode (101a of FIG. 1), source/drain electrodes, and a channel layer (not shown). The gate electrode protrudes toward the sub-pixel region in a wider width than that of the gate line 101.

A common electrode 150 with a plate shape is disposed within the sub-pixel region in a parallel direction with the data line 103. The common electrode 150 is formed in such a manner as to overlap with the data line 103.

A pixel electrode 129 with a plurality of slits is disposed on the common electrode 150 with having a passivation layer therebetween. One side of the pixel electrode 129 is electrically connected to the drain electrode of the thin film transistor through a first contact hole 401.

Also, a common line can be formed on the circumference of the pixel region in a single body united with the common electrode 150. In other words, the common electrode 150 can be formed to have the plate shape in the sub-pixel region, and the common line, which is united with the common electrode 150 in a single body, can be disposed in regions of the thin film transistor, the gate line 101 and the data line 103.

In the embodiment of the present disclosure, the pixel and common electrodes 129 and 150 extending along the data line 103 are formed in an up-down symmetric configuration with respect to a center line of the sub-pixel region which is parallel to the gate line 101. Also, the pixel electrode 129 and the common electrode 150 bend diagonally in top and bottom directions with respect to the center line of the sub-pixel region.

Moreover, a gate pad 110 extending from the gate line 101 is formed in the gate pad region of the LCD device. A gate pad contact electrode 310 is formed on the gate pad 110. The gate pad 110 and the gate pad contact electrode 310 are electrically connected to each other through a second contact hole 402.

Furthermore, a data pad 120 extending from the data line 103 is formed a data pad region of the LCD device. A data pad contact electrode 320 is formed on the data pad 120. The data pad 120 and the data pad contact electrode 320 are electrically connected to each other through a third contact hole 403.

FIGS. 2A through 2F are cross-sectional views illustrating a fabrication process of the thin film transistor array substrate according to an embodiment of the present disclosure. FIGS. 2A through 2f are cross-sectional views taken along lines I-I', II-II' and III-III' of FIG. 1, in order to illustrate the fabrication process of the thin film transistor array substrate.

Figure 2A:
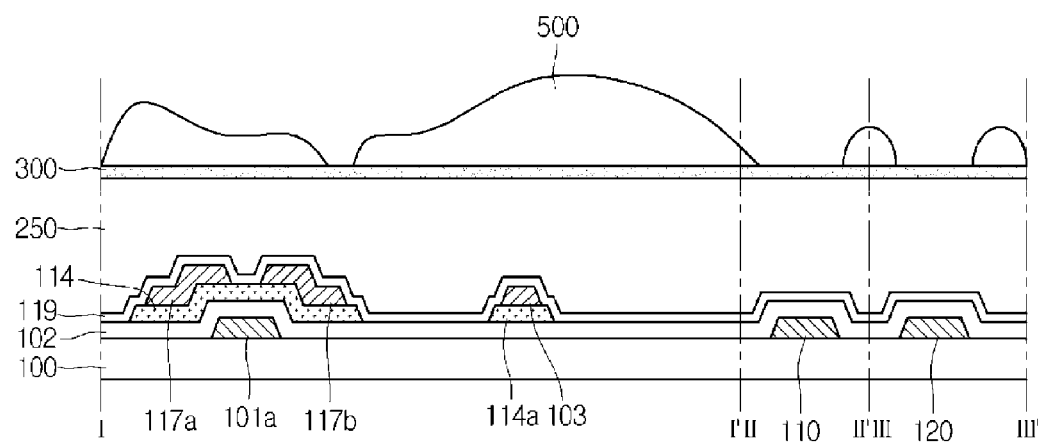
FIGS. 2A through 2F are cross-sectional views illustrating a fabrication process of the thin film transistor array substrate according to an embodiment of the present disclosure.

Referring to FIG. 2A, a gate electrode 101a, and a gate pad 110 and a data pad 120 are formed on a substrate 100 which is formed from a transparent insulation material. The gate electrode 101a is formed in a sub-pixel region within the display area. The gate pad 110 and the data pad 120 are formed in a pad region within the non-display area. The gate electrode 101a, the gate pad 110 and the data pad 120 can be prepared by forming a first metal film through a sputtering process and performing a first mask procedure for the first metal film.

The data pad 120 can be electrically connected to a data line, which will be formed later, through another metal film in the boundary between the display area and the non-display area.

The first mask procedure can be performed by forming a photo resist film on the deposited metal film, patterning the photo resist film into a photo resist pattern through exposure and development processes using a first mask, and performing an etching process which uses the photo resist pattern as an etch mask. The photo resist film is formed from a photosensitive material.

The above-mentioned first mask procedure allows a gate line (101 of FIG. 1) to be formed together with the gate electrode 101a, the gate pad 110 and the data pad.

The first metal film can be formed from at least one material among molybdenum Mo, titanium Ti, tantalum Ta, tungsten W, copper Cu, Chromium Cr, aluminum Al, alloys thereof, and a transparent conductive material such as indium-tin-oxide ITO, indium-zinc-oxide IZO or others. Also, the first metal film can be formed in at least one layer.

When the gate electrode 101a and so on are formed on the lower substrate 100 as described above, a gate insulation film 102 is formed on the entire surface of the substrate 100. Also, a channel layer 114 is formed on the gate insulation film 102 opposite to the gate electrode 101a. The channel layer 114 can be prepared by forming a semiconductor layer configured with an amorphous silicon film and an n+ or p+ doped amorphous silicon film and then performing a second mask procedure for the semiconductor layer.

Thereafter, source/drain electrode 117a and 117b and the data line 103 are formed on the substrate 100 provided with the channel layer 114. The source/drain electrodes 117a and 117b and the data line 103 can be prepared by forming a second metal film on the substrate 100 provided with the channel layer 114 and performing a third mask procedure for the second metal film.

The second metal film (or source/drain metal film) from one material among molybdenum Mo, titanium Ti, tantalum Ta, tungsten W, copper Cu, Chromium Cr, aluminum Al, and alloys thereof. Alternatively, the second metal film can be formed from a transparent conductive material such as indium-tin-oxide ITO, indium-zinc-oxide IZO or others. As shown in the drawings, the second metal film is formed in a single layer. However, the second metal film can be formed in a stacked layer structure of at least two films layer.

In other way, the channel layer 114 and the source/drain electrodes 117a and 117b can be formed through a single mask procedure.

In this case, the gate insulation film 102, the semiconductor layer configured with the amorphous silicon film and the n+ or p+ doped amorphous silicon film, and the source/drain metal film are sequentially formed on the lower substrate 100 provided with the gate electrode 101a and so on. Afterward, a second mask procedure using a half-tone mask or a diffractive mask is performed so that the channel layer 114, the source/drain electrodes 117a and 117b and the data line 103 can be simultaneously formed. At this time, a semiconductor pattern 114a remains under the data line 103.

After the formation of a thin film transistor is completed as described above, a first passivation layer 119 is formed on the entire surface of the substrate 100. Subsequently, a photo acryl layer 250 and a transparent metal layer 300 are formed on the first passivation layer 119.

The photo acryl layer 250 can be formed from an organic material. The photo acryl layer 250 has preferably a lower dielectric constant than that of the first passivation layer 119. The dielectric constant of the photo acryl layer 250 is set in a range of 3.0~4.0. Preferably, the dielectric constant of the photo acryl layer 250 is set in a range of 3.4~3.8. Also, the photo acryl layer can be formed in a thickness range of 3~6 μm. If the photo acryl layer 250 with low dielectric constant is used, the first passivation layer 119 can be formed in a thickness of 1000 Å.

The transparent metal layer 300 can be formed from one of indium-tin-oxide ITO and indium-zinc-oxide IZO.

Subsequently, a first photo resist pattern 500 with different thicknesses is formed on the transparent metal layer 300. The first photo resist pattern 500 can be prepared by forming a photo resist on the entire surface of the substrate 100 and performing a fourth mask procedure, which uses a half-tone mask or a diffractive mask, for the photo resist. The fourth mask procedure may be replaced by the third mask procedure in case the channel layer 114 and the source/drain electrodes 117a and 117b are simultaneously formed.

Figure 2B:
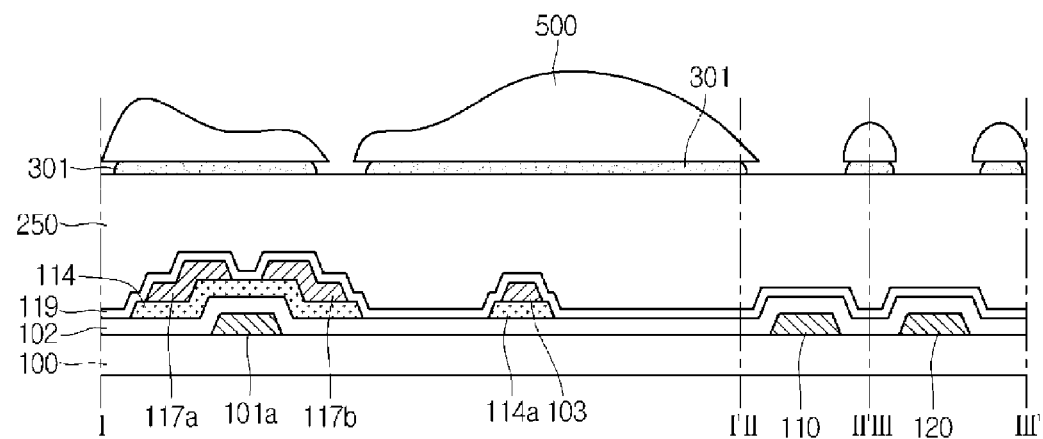

When the first photo resist pattern 500 is formed on the transparent metal layer 300, the transparent metal layer 300 in contact hole formation regions is etched through a wet etching process which uses the first photo resist pattern 500 as an etching mask, as shown in FIG. 2B. As such, a transparent metal pattern 301 can be formed under the first photo resist pattern 500 with the sub-pixel region.

Figure 2C:
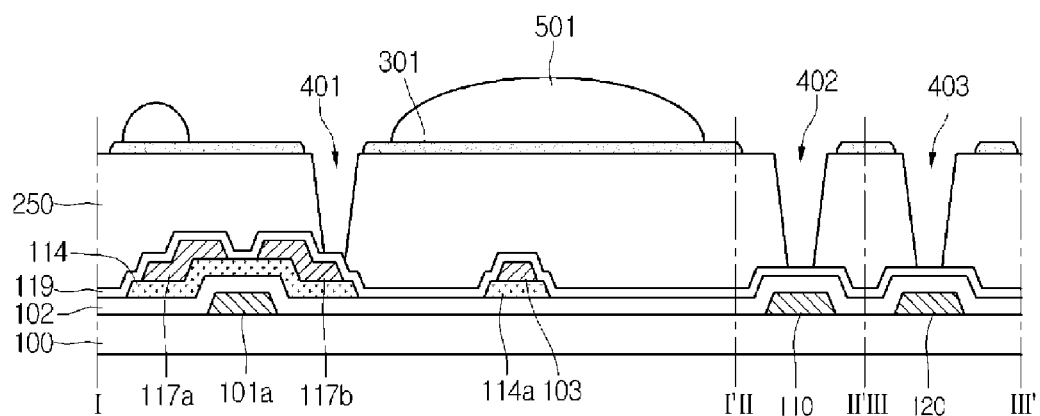
Figure 2D:
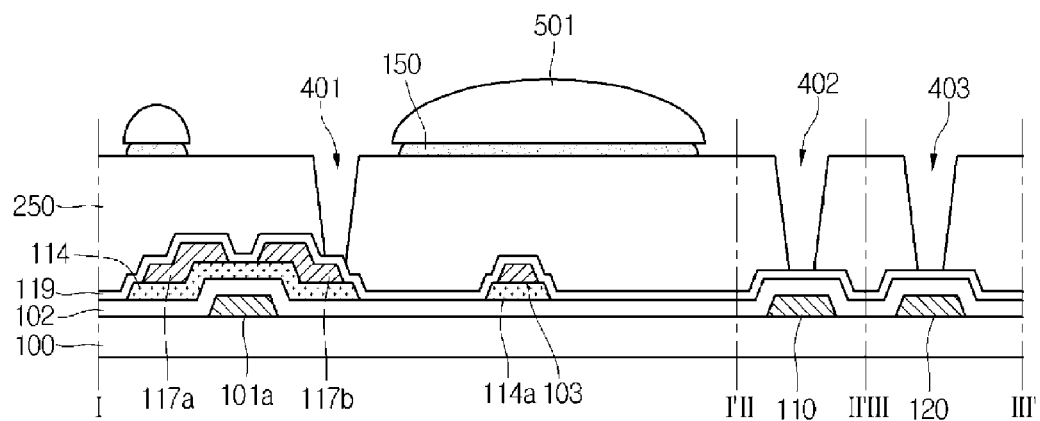

Thereafter, as shown in FIGS. 2C and 2D, the photo acryl layer 250 above the drain electrode 117b, the gate pad 110 and data pad 120 is etched through a dry etching process which uses the first photo resist pattern 500 as an etching mask, thereby forming first through third contact holes 401~403. At this time, the first passivation layer 119 on the drain electrode 117b, the gate pad 110 and the data pad 120 remains, but the photo acryl layer 250 is removed.

When the first through third contact holes 401~403 are formed in the photo acryl layer 250, an ashing process is performed for the first photo resist pattern 500 in order to form a second photo resist pattern 501 on the transparent metal pattern 301.

Continuously, a second wet etching process using the second photo resist pattern 501 as an etching mask is performed for the transparent metal pattern 301 so that a common electrode 150 is formed in the sub-pixel region.

Figure 2E:
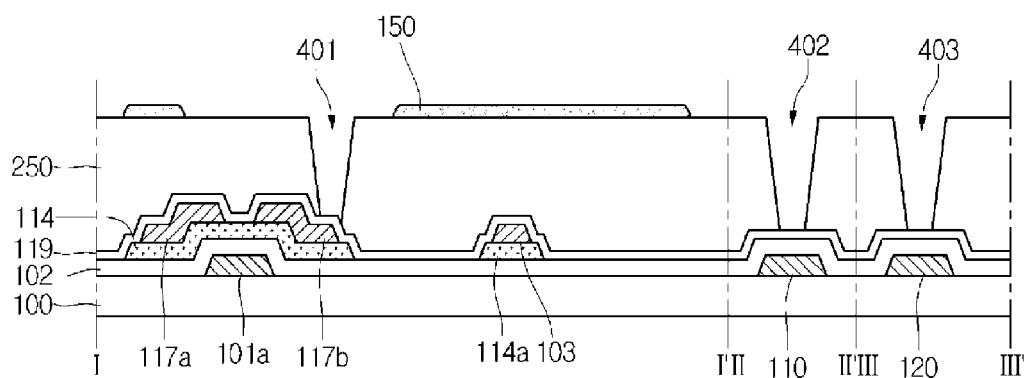

When the common electrode 150 is formed on the photo acryl layer 250, the second photo resist pattern 501 is removed by performing a strip process, as shown in FIG. 2E.

Figure 2F:
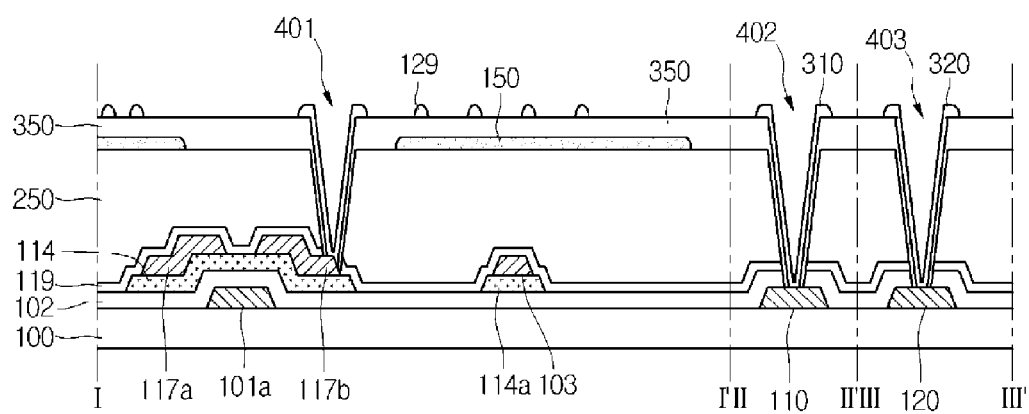

Afterward, as shown in FIG. 2F, a second passivation layer 350 is formed on the entire surface of the substrate 100. Also, the first and second passivation layers opposite to the first through third contact hole regions are removed through a fifth mask procedure.

The fifth mask procedure enables the drain electrode 117b, the gate pad 110 and the data pad 120 to be exposed to the exterior. Also, the fifth mask procedure may be replaced by the fourth mask procedure in case the channel layer 114 and the source/drain electrodes 117a and 117b are simultaneously formed.

Next, a pixel electrode 129 is formed on the second passivation layer 350 opposite the common electrode 150. The pixel electrode 129 can be prepared by forming another transparent metal layer on the entire surface of the substrate 10 and performing a sixth mask procedure for another transparent metal layer. The pixel electrode 129 is electrically connected to the drain electrode 117b through the first contact hole 401. The sixth mask procedure may be replaced by the fifth mask procedure in case the channel layer 114 and the source/drain electrodes 117a and 117b are simultaneously formed.

As described above, the embodiment of the present disclosure enables the contact holes to be simultaneously formed using a diffractive mask or half-tone mask procedure when the common electrode is formed on the photo acryl layer which is used for high definition and low power consumption.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:

1. A method of fabricating a thin film transistor array substrate, the method comprising:
   preparing a substrate defined into a display area and a non-display area;
   forming a gate electrode and a gate line, which are disposed in the display area, and a gate pad and a data pad, which are disposed in the non-display area, by forming a metal film on the substrate and performing a first mask procedure for the metal film;
   sequentially forming a gate insulation film and a channel layer on the substrate provided with the gate electrode;
   forming source/drain electrodes and a data line by forming a source/drain metal film on the substrate provided with the channel layer and performing a second mask procedure for the source/drain metal film;
   sequentially forming a first passivation layer, a photo acryl layer and a first transparent metal layer on the substrate provided with the source/drain electrodes;
   forming a common electrode, which is disposed in the pixel region, and first through third contact holes, which are positioned in regions of the drain electrode, the gate pad and the data pad, respectively, using one of a half-tone mask and a diffractive mask;
   forming a second passivation layer on the substrate provided with the first through third contact holes;
   exposing the drain electrode, the gate pad and the data pad by removing the first and second passivation layers from the drain electrode region, the gate pad region and data pad region; and
   forming a pixel electrode on the second passivation layer opposite to the common electrode by forming a second transparent metal layer on the substrate and performing a third mask procedure for the second transparent metal layer.

2. The method of claim 1, wherein the formation of the common electrode and the first through third contact holes includes:
   forming a first photo resist pattern on the first transparent metal layer;
   forming the first through third contact holes by removing the photo acryl layer from the drain electrode region, the gate pad region and the data pad region using wet and dry etching processes;
   forming a second photo resist pattern by performing an ashing process for the substrate provided with the first through third contact holes; and
   forming the common electrode on the photo acryl layer by wet etching the first transparent metal layer using the second photo resist pattern as an etch mask.

3. The method of claim 1, wherein the first passivation layer on the drain electrode, the gate pad and the data pad remains after the formation of the first through third contact holes.

4. The method of claim 1, wherein the photo acryl layer is formed from an organic material.

5. The method of claim 1, wherein the photo acryl layer has a lower dielectric constant than that of the first passivation layer.

6. The method of claim 5, wherein the dielectric constant of the photo acryl layer is in a range of about 3.4~about 3.8.

7. The method of claim 5, wherein the first passivation layer is formed in a thickness of about 1000 Å.

8. A method of fabricating a thin film transistor array substrate, the method comprising:
 preparing a substrate defined into a display area and a non-display area;
 forming a gate electrode and a gate line, which are disposed in the display area, and a gate pad and a data pad, which are disposed in the non-display area, by forming a metal film on the substrate and performing a first mask procedure for the metal film;
 forming source/drain electrodes and a data line by forming a gate insulation film, a semiconductor layer and a source/drain metal film on the substrate provided with the gate electrode and performing form the semiconductor layer and the source/drain metal film a second mask procedure which uses one of a first half-tone and a first diffractive mask;
 sequentially forming a first passivation layer, a photo acryl layer and a first transparent metal layer on the substrate provided with the source/drain electrodes;
 forming a common electrode, which is disposed in the pixel region, and first through third contact holes, which are positioned in regions of the drain electrode, the gate pad and the data pad, respectively, using one of a half-tone mask and a diffractive mask;
 forming a second passivation layer on the substrate provided with the first through third contact holes;
 exposing the drain electrode, the gate pad and the data pad by removing the first and second passivation layers from the drain electrode region, the gate pad region and data pad region; and
 forming a pixel electrode on the second passivation layer opposite to the common electrode by forming a second transparent metal layer on the substrate and performing a third mask procedure for the second transparent metal layer.

9. The method of claim 8, wherein the formation of the common electrode and the first through third contact holes includes: forming a first photo resist pattern on the first transparent metal layer; forming the first through third contact holes by removing the photo acryl layer from the drain electrode region, the gate pad region and the data pad region using wet and dry etching processes; forming a second photo resist pattern by performing an ashing process for the substrate provided with the first through third contact holes; and forming the common electrode on the photo acryl layer by wet etching the first transparent metal layer using the second photo resist pattern as an etch mask.

10. The method of claim 8, wherein the first passivation layer on the drain electrode, the gate pad and the data pad remains after the formation of the first through third contact holes.

11. The method of claim 8, wherein the photo acryl layer is formed from an organic material.

12. The method of claim 8, wherein the photo acryl layer has a lower dielectric constant than that of the first passivation layer.

13. The method of claim 12, wherein the dielectric constant of the photo acryl layer is in a range of about 3.4-about 3.8.

14. The method of claim 12, wherein the first passivation layer is formed in a thickness of about 1000 Å.

* * * * *